United States Patent [19]

Amagasa et al.

[11] Patent Number: 4,646,131
[45] Date of Patent: Feb. 24, 1987

[54] RECTIFIER DEVICE

[75] Inventors: Nobutada Amagasa; Ryoji Takatani, both of Kobe; Hiroshi Inoo, Amagasaki; Kazuichi Suzuki; Mitsuo Kiriyama, both of Kobe, all of Japan

[73] Assignee: Mitsubishi Denki Kabushiki Kaisha, Tokyo, Japan

[21] Appl. No.: 553,395

[22] Filed: Nov. 18, 1983

[30] Foreign Application Priority Data

Jan. 28, 1983 [JP] Japan ................. 58-13387
Jan. 28, 1983 [JP] Japan ................. 58-13388

[51] Int. Cl.⁴ .................. H01L 23/42; H01L 39/02
[52] U.S. Cl. ........................... 357/79; 357/74; 357/81
[58] Field of Search .............. 357/74, 75, 79, 80, 357/76, 81

[56] References Cited

U.S. PATENT DOCUMENTS

| | | | |
|---|---|---|---|
| 2,751,528 | 6/1956 | Burton | 357/79 |
| 3,521,132 | 7/1970 | Petersen et al. | 357/79 |
| 3,654,528 | 4/1972 | Barkan | 357/79 |
| 3,721,843 | 3/1973 | Spisak et al. | 310/68 D |
| 3,852,628 | 12/1974 | Spisak et al. | 310/68 D |
| 3,872,335 | 3/1975 | Petersen et al. | 310/68 D |
| 3,890,637 | 6/1975 | Yamamoto | 357/76 |
| 4,021,839 | 5/1977 | Denlinger | 357/79 |
| 4,141,030 | 2/1979 | Eisele et al. | 357/79 |
| 4,150,394 | 4/1979 | Sugawa et al. | 357/74 |
| 4,274,106 | 6/1981 | Ohdate | 357/79 |
| 4,313,128 | 1/1982 | Schlegel et al. | 357/78 |
| 4,340,902 | 7/1982 | Honda et al. | 357/74 |

FOREIGN PATENT DOCUMENTS 2841370 3/1980 Fed. Rep. of Germany ........ 357/79
1168554 10/1969 United Kingdom ................ 357/79

Primary Examiner—William L. Sikes
Assistant Examiner—Frank González
Attorney, Agent, or Firm—Wenderoth, Lind & Ponack

[57] ABSTRACT

A rectifier device which includes a first radiating fin, a flat type semiconductor element which is disposed in contact with one surface of said first radiating fin, a substantially cylindrical insulating envelope which envelopes the flat type semiconductor element and one side of which is coupled with said first radiating fin, a second radiating fin which is coupled with the other side of the insulating envelope, and a through conductor which is threadably inserted through a central part of said second radiating fin and which lies in contact with said flat type semiconductor element.

3 Claims, 6 Drawing Figures

FIG. 1A PRIOR ART
FIG. 1B PRIOR ART
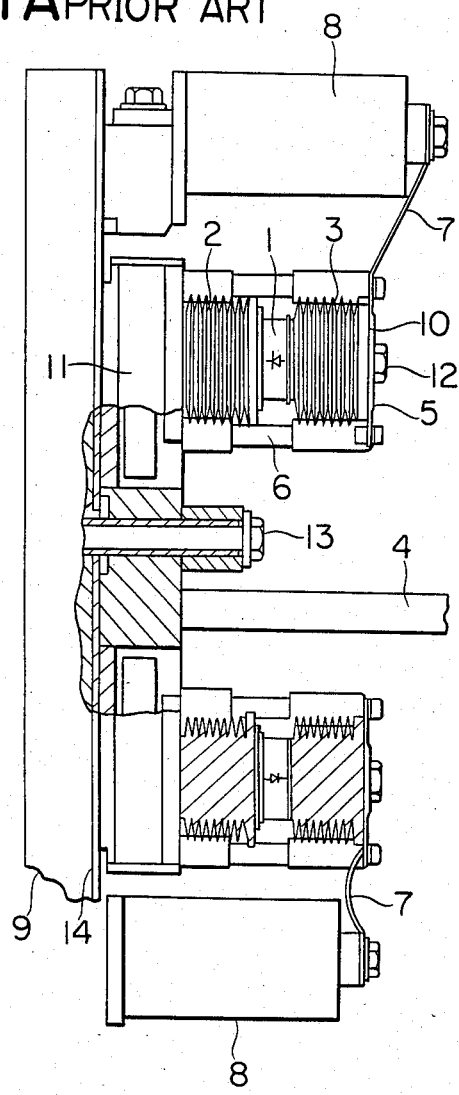
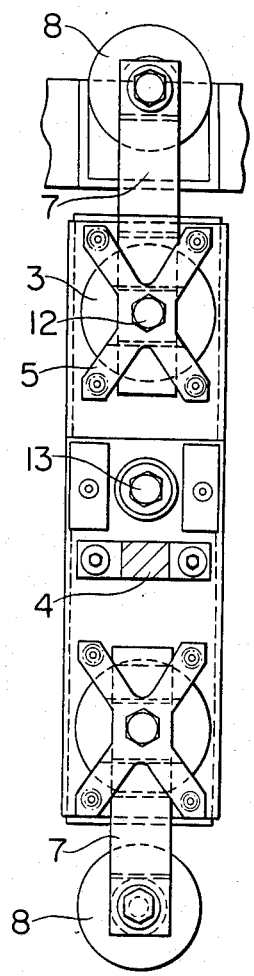
FIG. 2
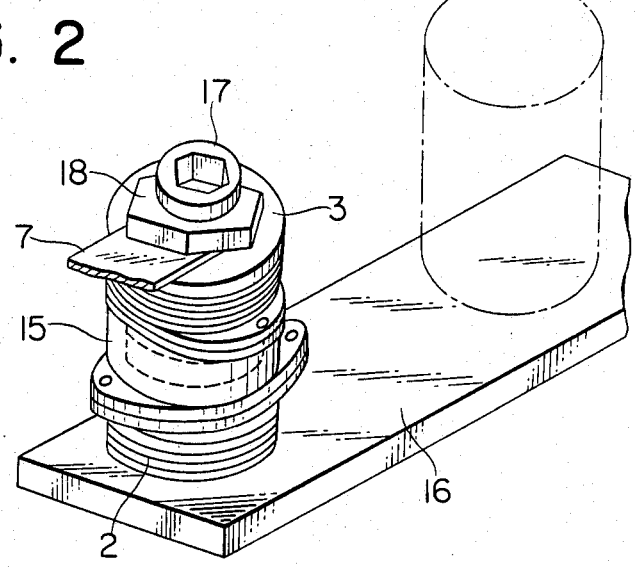

RECTIFIER DEVICE

BACKGROUND OF THE INVENTION

This invention relates to the structure of a rectifier device which employs a flat type element.

For example, a brushless excitation apparatus is such that an A.C. exciter and a rotary rectifier device rotate coaxially, and it supplies direct current without using a slip ring as the excitation apparatus of any of small-sized to large-sized A.C. machines. The rotary rectifier device requires components such as a semiconductor element (usually a diode), radiating fins and a fuse, and a large number of members including predetermined connectors and supporters. In addition, it needs to endure a great centrifugal force during the rotation and to be packed in the smallest possible structure.

A prior-art rotary rectifier device employing a flat type element and for use with a large-sized exciter has a structure as shown in FIGS. 1A and 1B. These figures illustrate one module of the prior-art rectifier device. Numeral 1 designates a flat type semiconductor element, which is held between radiating fins 2 and 3. Numeral 11 indicates a capacitor, and numeral 4 an A.C. side terminal. Numeral 5 indicates a leaf spring which is mounted on the radiating fin 3 by a bolt 12 and which exerts a pressure on the semiconductor element 1 through a spacer 10. Insulating struts 6 support the leaf spring 5 unitarily with the radiating fin 3 and the semiconductor element 1. Shown at numerals 7 are D.C. side terminals. A fuse 8 is connected in electrical series with the semiconductor element 1. The assembly made up of the semiconductor element 1, radiating fins 2 and 3, capacitor 11, etc., is fixed to a wheel 9 through an insulator 14 by an insulating bolt 13.

The flat type semiconductor element 1 has the radiating fins 2 and 3 disposed on both its surfaces, and is subjected to a proper contact pressure. This brings forth the advantages that the semiconductor element can conduct a greater current than a stud type diode having heretofore been utilized, and that the device can be made smaller in size. In order to fully exploit the advantages, the prior art adopts the structure wherein the semiconductor element 1 and the radiating fins 2 and 3 on both the sides thereof are sandwiched between the capacitor 11 and the spring 5 and wherein they are supported by the insulating struts 6 collectively and are held by a spring pressure which is adjusted by the thickness of the spacer 10 inserted centrally of the spring 5.

Such a prior-art module structure has a great cooling capability, and is practical. Since, however, the semiconductor element is not completely enclosed, it is liable to become dirty, which may lower its dielectric strength. Another disdvantage is that the insulating struts protrude, so that the windage loss due to rotation is heavy.

SUMMARY OF THE INVENTION

This invention has been made in view of the above drawbacks, and has for its object to provide a module structure free from the disadvantages without degrading the cooling capability thereof.

In one aspect of performance of the present invention, a rectifier device comprises a first radiating fin, a flat type semiconductor element which is disposed in contact with one surface of said first radiating fin, a substantially cylindrical insulating envelope which envelops said flat type semiconductor element and one side of which is coupled with said first radiating fin, a second radiating fin which is coupled with the other side of said insulating envelope, and a through conductor which is thereby inserted through a central conductor which is threadably inserted through a central part of said second radiating fin and which lies in contact with said flat type semiconductor element.

BRIEF DESCRIPTION OF THE DRAWINGS

FIG. 1A is an elevational view, partly broken away, of a prior-art rectifier device;

FIG. 1B is a plan view of the rectifier device shown in FIG. 1A;

FIG. 2 is a schematic perspective view of an embodiment of a rectifier device according to the present invention;

In the drawings, the same symbols indicate the same or corresponding parts.

DESCRIPTION OF THE PREFERRED EMBODIMENTS

Figure 3A:
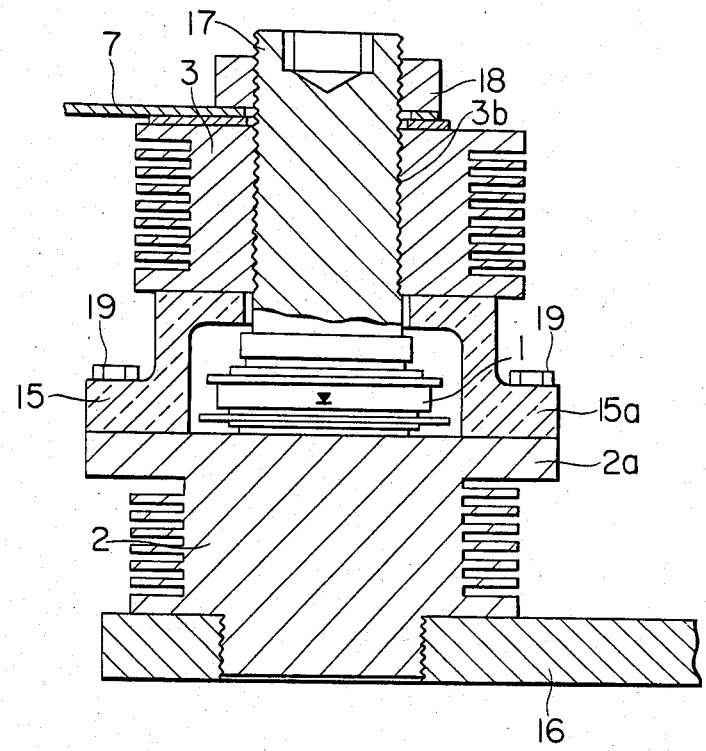
FIG. 3A is a sectional elevational view showing the details of the rectifier device in FIG. 2.

FIG. 2 is a schematic perspective view which shows an embodiment of a rectifier device according to the present invention. Referring to FIG. 2, numeral 15 designates an insulating envelope which is made of a ceramic material and in which a flat type semiconductor element 1 is received. Numeral 16 indicates a seat plate, numeral 17 a through conductor, and numeral 18 a hexagon nut. Since the other constituents are similar to those in FIGS. 1A and 1B, they shall not be repeatedly explained. The capacitor and the fuse are omitted from the illustration. Current flows along a path from an A.C. source to seat plate 16 to radiating fin 2 to semiconductor element to radiating fin 3 to D.C. side terminal 7 to the fuse. In a module (indicated in FIG. 1 by the dot-and-dash-line) on the opposite side of seat plate 16, current flows reversely to the above.

Figure 3B:
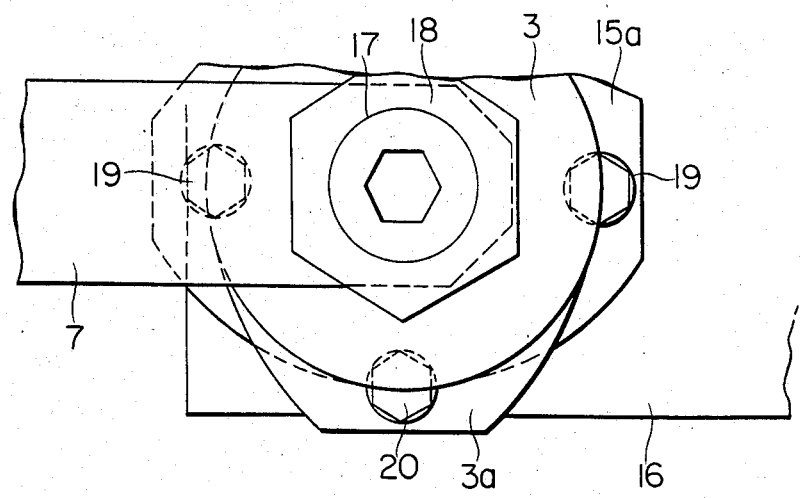
FIG. 3B is a plan view, partly broken away, corresponding to FIG. 3A.
Figure 4:
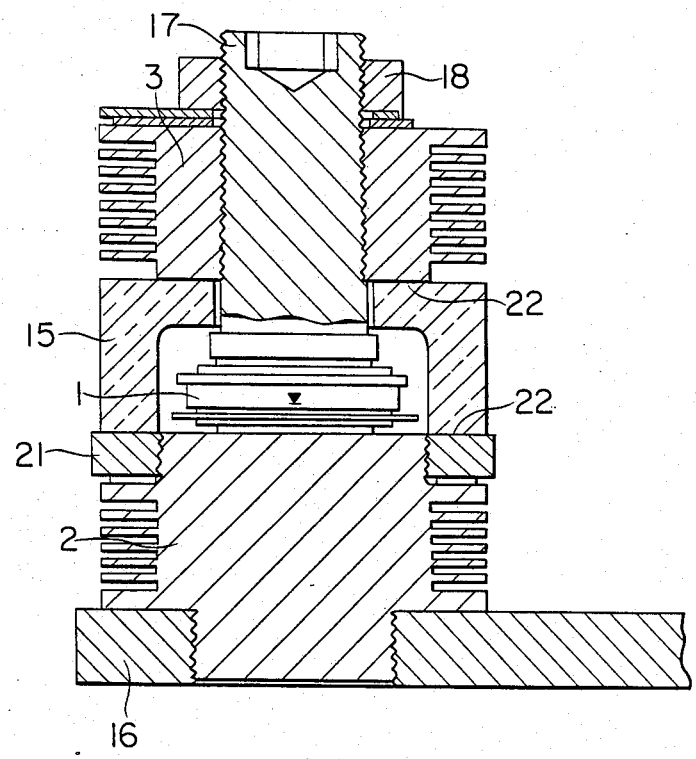
FIG. 4 is a sectional elevational view showing another embodiment of the present invention.

FIGS. 3A and 3B are respectively a front view and a plan view, partly broken away, showing the details of the embodiment. Referring to the figures, the radiating fin 2 has its one end threadably mounted on the seat plate 16 and forms the first radiating fin. The other radiating fin 3 forms the second radiating fin and is unitarily coupled with the ceramic insulating envelope 15 by means of clamping bolts 20 (FIG. 3B). The insulating envelope 15 is further coupled to the radiating fin 2 by means of clamping bolts 19. That is, the radiating fins 2 and 3 and the insulating envelope 15 have flanges 2a, 3a and 15a so as to be placed one over the other, respectively, and the flanges are coupled by the clamping bolts 19 and 20. The flanges 2a and 3a are staggered in order to facilitate the operations of coupling the bolts. The central inner periphery of the radiating fin 3 is provided with an internal thread 3b, and the bolt-like through conductor 17 is threadably inserted therethrough. When the flat type semiconductor element 1 is set on the radiating fin 2 and the ceramics envelope 15 is fixed to the radiating fin 2 by the clamping bolts 19, the semiconductor element 1 is sandwiched between the radiating fin 2 and the through conductor 17. A pressure on the semiconductor element 1 can be adjusted by the clamping of the through conductor 17. After the through conductor 17 has been clamped with a predetermined clamping torque, it is fixed by, for example, an anti-swivel pin. The D.C. side terminal 7 is fixed by the hexagon nut 18. In case of applying the present structure to a rotary rectifier device, it is attached to a rotating member through the seat plate 16, and the loads of the through conductor etc. due to a turning force which acts on the semiconductor element. As the pressure based on the clamping, therefore, a small pressed-contact force at rest and at low speed may be afforded. During the ordinary operation, the other loads act to produce a necessary pressed-contact force. Regarding the cooling performance, heat radiates to the radiating fin 3 from the through conductor 17 as well as the radiating fin 2. When the insulating envelope 15 is made of a ceramic material, the heat conduction thereof can also be utilized. Therefore, a cooling capability equal to that of the prior art shown in FIGS. 1A and 1B is possible. For the insulating envelope 15, the ceramics can be replaced with an insulator of high strength, such as flass epoxy resin. Further, in a case where the insulating envelope 15 is formed of a metal body and where the surface of the metal body is provided with an insulating layer by flame spraying a ceramic material thereon, the good thermal conductivity properties of the metal body can be advantageously utilized FIG. 4 shows another embodiment of this invention. The insulating envelope 15 and the radiating fin 3 are unitarily bonded (at numeral 22) by metal bonding such as brazing, instead of the clamping bolts 20 in FIG. 3B. Further, a nut 21 replacing the bolts 19 in FIG. 3B is bonded (at numeral 22) unitarily with the insulating envelope 15 by brazing or the like, and it is fixed in threadable engagement with the radiating fin 2. In order to compensate for the difference in thermal expansions in the metal bonding another metal should desirably be inserted between the surfaces of the metal bonding.

In the present invention having the construction as described above, the semiconductor element can be concealed without decreasing the cooling performance therefor, and the degradation of the dielectric strength thereof due to straining is not effected. Moreover, the components of the module can be assembled in a shape close to a cylinder, and the windage loss of the rectifier device during the rotation can be reduced.

What is claimed is:

1. A rectifier device comprising a first radiating fin, a flat type semiconductor element which is disposed in contact with one surface of said first radiating fin, a substantially cylindrical insulating envelope which surrounds said flat type semiconductor element and one side of which is coupled with said first radiating fin, a second radiating fin which is coupled with another side of said insulating envelope opposite said one side, and a through conductor which threadably extends through a central part of said second radiating fin and which lies in contact with said flat type semiconductor element, such that said flat type semiconductor element is completely enclosed by said first and second radiating fins, said through conductor and said insulating envelope.

2. A rectifier device according to claim 1, wherein said insulating envelope comprises a metal body, a surface of which has a ceramic layer flame sprayed.

3. A rectifier device according to claim 1, wherein said insulating envelope is made of a ceramic material, said insulating envelope being metal bonded to said first and second radiating fins.

* * * * *